United States Patent
Holst et al.

(10) Patent No.: US 8,395,257 B2
(45) Date of Patent: Mar. 12, 2013

(54) ELECTRONIC MODULE AND METHOD FOR PRODUCING AN ELECTRIC FUNCTIONAL LAYER ON A SUBSTRATE BY BLOWING POWDER PARTICLES OF AN ELECTRICALLY CONDUCTIVE MATERIAL

(75) Inventors: Jens-Christian Holst, Berlin (DE); Jens Dahl Jensen, Berlin (DE); Karl Weidner, Muünchen (DE); Robert Weinke, München (DE)

(73) Assignee: Siemens Aktiengesellschaft, Munich (DE)

(*) Notice: Subject to any disclaimer, the term of this patent is extended or adjusted under 35 U.S.C. 154(b) by 936 days.

(21) Appl. No.: 12/310,070

(22) PCT Filed: Jul. 31, 2007

(86) PCT No.: PCT/EP2007/057833
§ 371 (c)(1),
(2), (4) Date: Feb. 10, 2009

(87) PCT Pub. No.: WO2008/017619
PCT Pub. Date: Feb. 14, 2008

(65) Prior Publication Data
US 2011/0272826 A1 Nov. 10, 2011

(30) Foreign Application Priority Data
Aug. 10, 2006 (DE) .......... 10 2006 037 532

(51) Int. Cl.
*H01L 23/48* (2006.01)
*H01L 23/52* (2006.01)
*H01L 29/40* (2006.01)

(52) U.S. Cl. ...... 257/734; 257/741; 257/750; 257/775; 257/782; 438/106; 438/666; 438/674; 438/677

(58) Field of Classification Search .............. None
See application file for complete search history.

(56) References Cited

U.S. PATENT DOCUMENTS

| 5,037,488 | A  | * | 8/1991 | Wienand ............... 136/230 |
| 6,025,618 | A  | * | 2/2000 | Chen ................... 257/295 |
| 7,654,223 | B2 |   | 2/2010 | Kim et al. |
| 2006/0121187 | A1 |   | 6/2006 | Haynes et al. |
| 2007/0200227 | A1 |   | 8/2007 | Licht et al. |

FOREIGN PATENT DOCUMENTS

| CN | 1154577 A | 7/1997 |
| CN | 1782127 A | 6/2006 |
| DE | 10045783 A1 | 11/2001 |
| DE | 102004018475 | 11/2005 |
| DE | 102004018475 A1 | 11/2005 |
| DE | 102004047357 A1 | 4/2006 |

(Continued)

OTHER PUBLICATIONS
DE102004047357 A1, Machine Translation.*

(Continued)

*Primary Examiner* — Evan Pert
*Assistant Examiner* — Andres Munoz
(74) *Attorney, Agent, or Firm* — Staas & Halsey LLP

(57) ABSTRACT

An electric functional layer is produced on a surface of a substrate, having at least an electronic component, particularly a semiconductor chip, provided thereof. The electric functional layer is formed using particles in powder of an electrically conductive material. The functional layer is blown on the surface of the substrate to form a thick and strong adhesive layer on impact with the substrate.

24 Claims, 2 Drawing Sheets

FOREIGN PATENT DOCUMENTS

| | | |
|---|---|---|
| DE | 102006003835 A1 | 2/2007 |
| EP | 0 768 708 A2 | 4/1997 |
| EP | 0768708 A | 4/1997 |
| WO | 2005/061116 A1 | 7/2005 |
| WO | 2005/104229 A1 | 11/2005 |

OTHER PUBLICATIONS

DE102004018475 A1, Machine Translation.*

Lee et al., "Correlation between Al2O3 particles and interface of Al-Al2O3 coatings by cold spray", Applied Surface Science, Elsevier, Amsterdam, NL, vol. 252, No. 5, Dec. 15, 2005, pp. 1891-1998; Others.

Klinkow et al., "Cold Spray Deposition: Significance of Particle Impact Phenomena", Aerospace Science and Technology, Editions Scientifiques et Medicates, Elsevier, vol. 9, No. 7, Oct. 2005, pp. 582-591; Others.

* cited by examiner

ELECTRONIC MODULE AND METHOD FOR PRODUCING AN ELECTRIC FUNCTIONAL LAYER ON A SUBSTRATE BY BLOWING POWDER PARTICLES OF AN ELECTRICALLY CONDUCTIVE MATERIAL

CROSS REFERENCE TO RELATED APPLICATIONS

This application is based on and hereby claims priority to German Application No. 10 2006 037 532.7 filed on Aug. 10, 2006 and PCT Application No. PCT/EP2007/057883 filed on Jul. 31, 2007, the contents of which are hereby incorporated by reference.

BACKGROUND OF THE INVENTION

The invention relates to a method for producing an electric functional layer on a surface of a substrate, on which at least one component, in particular a semiconductor chip, is arranged.

The starting point for the production of an electronic module is a semi-finished product with a substrate to which a structured metal layer with metal or contact surfaces is applied. Some of the contact surfaces feature one or several components, for example a semiconductor chip or a passive component. The component or components is or are connected to the respective contact surface by an adhesive agent, usually solder. If one of the components exhibits a rear-side contact, i.e. a contact facing towards the substrate, the adhesive agent creates not only a mechanical and but also an electrical connection to the respective contact surface.

For electrical contacting some of the components exhibit a number of contact surfaces on their top side facing away from the substrate. The electrical connection between the contact surfaces themselves and/or one of the contact surfaces of the metal layer is usually formed by using bond wires.

Alternatively, the electrical connections between the contact surfaces of the components and/or a contact surface of the metal layer can be produced by planar connection technology, in which a surface of the semi-finished product is initially covered with an insulation layer, for example a plastic foil of an insulating material. At the locations of the contact surfaces openings are inserted in the insulation layer so that the contact surfaces are not covered. Subsequently a thin metal layer is applied by sputtering, vapor deposition or other methods to produce thin contact layers over the entire surface of the insulation layer and the inserted openings. The sputter layer is for example an approx. 50-nm layer of titanium and an approx 1-μm layer of copper. Onto this sputter layer a light-sensitive foil (photo foil), usually an insulating material, is applied. The thickness of the photo foil is between 20 and 200 μm and in a further step it is exposed and developed according to the desired conductive structure.

Exposure usually takes place using a mask with which the layout of the conductive structure is transferred to the photo foil. The sections of the photo foil intended to form the later electrically conductive structure or functional layer are shaded by the mask. The non-exposed sections of the photo foil can be removed in a further step to reveal the sputter layer, or more precisely the copper surface, underneath. By immersing the prepared semi-finished product in an electrolyte bath, in particular a copper electrolyte bath, a copper layer with a thickness of approx. 20 to 200 μm is produced by galvanic growth. In a next step, referred to as stripping the photo foil, the photo foil still on the surface is removed in the places where no electrically conductive structure is required. In a final step, referred to as differential etching, the sputter layer of titanium and copper is removed from the entire surface so that only the desired conductive structure or functional layer remains.

If the components are configured as power semiconductor components the conductive structure or functional layer is usually made of copper. The required layer thickness ranges from 20 to 500 μm.

Planar connection technology has the advantage that the electronic module produced is much lower in height than electronic modules which have conventional wires. Owing to the numerous steps required, however, this connection technology entails higher costs.

SUMMARY

It is therefore one potential object to specify a method for producing an electric functional layer on a surface of a substrate which furnishes reliable electrical contacting and at the same time is favorable in terms of cost.

The inventor propose producing an electric functional layer on a surface of a substrate, on which at least one electronic component, in particular a semiconductor chip, is arranged, the electric functional layer is formed by selectively blowing powder particles of an electrically conductive material onto the surface of the substrate so that on impact with the substrate they form a dense and strongly adhering layer.

The proposed has the advantage that an electrical connection can be produced cost-effectively and quickly by planar technology. The electronic module produced by the method only has a low installation height. Compared with thermal flame spraying, highly dense layers can be produced. The functional layer exhibits high electrical as well as high thermal conductivity. The functional layer is wear resistant and very hard, even though only a low heat input into the substrate takes place during production. As very high application rates exceeding 100 μm per minute are possible the process times for the manufacture of electric functional layers can be reduced to minutes.

To apply the particles, which are in powder form, the particles are injected into a process gas which has been heated up and accelerated to supersonic speed, preferably to a speed range between 300 and 1,200 m/s. The process gas is accelerated to supersonic speed preferably by expansion of the process gas in a nozzle.

The particles injected into the process gas are preferably made of metal, in particular copper, titanium, silver, nickel and mixtures thereof. It is particularly preferable for the particles to be injected into the process gas as nanoparticles.

The electric functional layer is produced according to the principle of cold gas spraying. Cold gas spraying is a coating method in which the coating material is applied to the substrate in powder form at very high speed. For this purpose, a process gas heated up to a few 100° C. is accelerated to supersonic speed by expansion in a Laval nozzle. The powder particles are then injected into the gas jet. The injected particles are accelerated to such a high speed that without any prior melting they form a dense and strongly adhering layer on impact with the substrate. The kinetic energy at the time of impact as a rule is not enough to cause the particles to melt completely.

According to one embodiment, the electric functional layer is applied to the entire surface of the substrate. This makes it possible to produce all-over or only partial shields to improve EMC behavior.

The electric functional layer can also be applied selectively to the surface of the substrate in order to create a conductor path structure.

To locally improve heat removal, provision can also be made during the manufacture of the electric functional layer for producing sections of different thickness. The thicker the conductive layer, the better the heat removal.

The proposed method enables passive components to be formed on the substrate surface during production of the electric functional layer. These could for example be resistors in meandering structure or capacitors (charge-storage diodes). It is also conceivable for three-dimensional structures with a differing component topography to be produced.

The functional layer can be formed from a number of layers of different or the same materials.

In principle any layer thicknesses can be produced in the electric functional layer. The thickness of the functional layer preferably lies between 20 µm and 5 mm.

Expediently, a sacrificial layer is applied to the surface of the substrate before application of the electric functional layer. The sacrificial layer prevents the components on the substrate from being damaged by the particles impacting at high kinetic energy.

To produce the sacrificial layer a thin metal layer is formed by sputtering, vapor deposition or PVD processes to produce thin contact layers. If the thickness of the sputter layer (usually in the region of 1 µm) is not enough to absorb the kinetic energy, provision can be made to increase the thickness of the sputter layer by galvanic deposition. Expediently, the sacrificial layer then produced exhibits a thickness of 1 µm to 50 µm.

The particles are preferably applied to the surface of the substrate by using a structured mask. The material used for the mask can be a highly elastic material which absorbs the kinetic energy of the particles on impact. Alternatively, the material used for the mask can be a soft material which changes shape when the particles impact. The material used for the mask can be a polymer for example which results in poor adhesion of the particles on the mask. A porous or brittle material can also be used as the material for the mask which breaks off during cold gas spraying. Such materials are for example made using ceramic pastes. A preformed metal mask with a surface coating can also be used as the mask, whereby the surface coating prevents adhesion of the particles on the surface. The surface coating forms a "non-stick coating". Finally, a structured photo foil with a silicone surface can be used as the mask.

Expediently, the surface of the substrate with the at least one component is provided with an insulation layer to which the electric functional layer is applied. In one configuration the insulation layer is made of organic or inorganic insulation material, in particular plastic, glass or ceramic.

The inventors also propose an electronic module including a substrate, on which at least one electronic component, in particular a semiconductor chip, is arranged and an electrically conductive functional layer. The electrically conductive functional layer is produced according to the described method.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
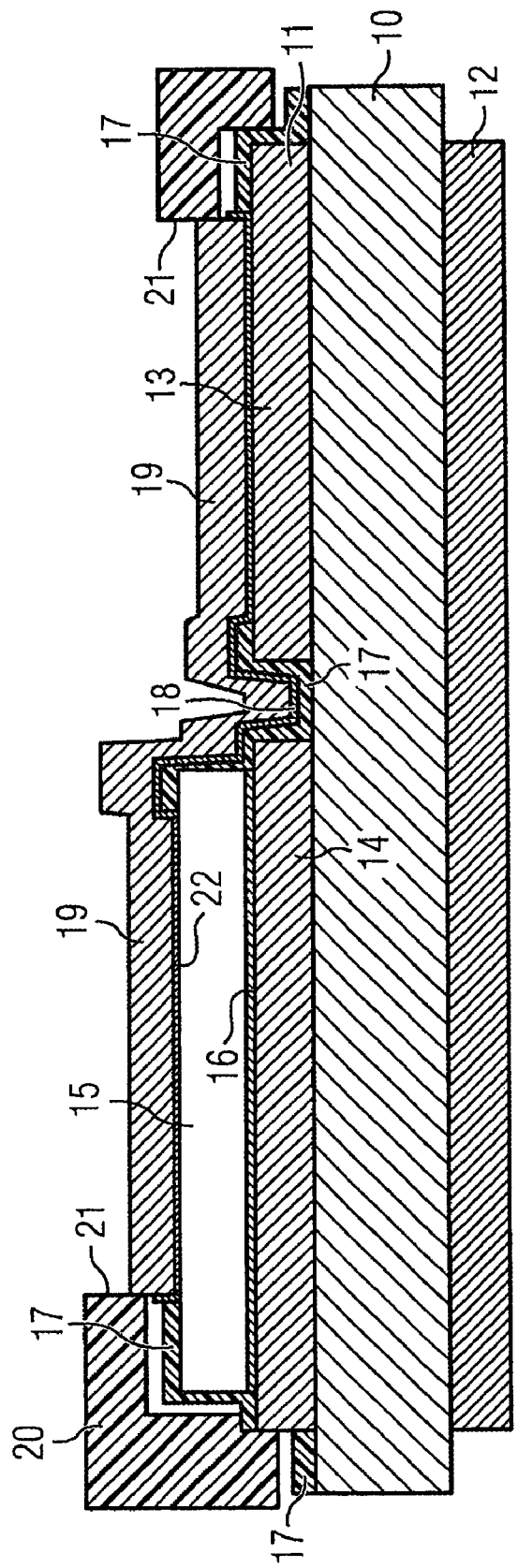
FIG. 1 shows a schematic representation of a section through an electronic module produced using the method in accordance with the invention.

Reference will now be made in detail to the preferred embodiments of the present invention, examples of which are illustrated in the accompanying drawing, wherein like reference numerals refer to like elements throughout.

A metal layer 11, for example made of copper, is formed on a top side of a substrate 10. The substrate 10 can for example be made of ceramic, printed circuit board material or flexible tape. The metal layer 11 exhibits a number of contact surfaces 13, 14, although only two contact surfaces are represented in the exemplary embodiment. On a bottom side opposite the top side of the substrate 10 a metal layer 12 is likewise formed, on which for example a heat sink can be arranged. For this purpose the metal layer 12 is, for example, formed over the entire surface and also made of copper.

For example a solder paste, a component 15, for example a power semiconductor component, is fixed to the contact surface 14 by an adhesive agent 16. The component exhibits a contact surface 22 on its top side facing away from the substrate. The surface of the described arrangement (hereinafter also referred to as the semi-finished product) is covered with an insulation layer 17. The insulation layer 17 may have been applied by a vacuum process. The thickness of the insulation layer 17 depends on the use of the finished electronic module, in particular on the voltages arising during operation of the module. Typically, the thickness of the insulation layer 17 ranges between 100 and 400 µm. The insulation layer 17 is applied in such a way that between the insulation layer 17 and the surface of the semi-finished product, comprising the metalized substrate with the component attached thereto, no air inclusions exist which would entail the risk of voltage flashovers. When applying the insulation coating 17, a method is preferably used which exerts no or hardly any stretching or compressive force on the side edges of the component. The insulation layer 17 therefore preferably exhibits a constant thickness over the entire surface of the semi-finished product, as a result of which the electrical properties of the finished electronic module are optimized. In the area of the contact surfaces 13 and 22 openings are inserted in the insulation layer 17. The openings are usually inserted by a laser.

After the insulation layer 17 has been applied and the openings have been inserted the surface of the semi-finished product which is to be covered with an electric functional layer is provided with a mask 20. The mask 20 can, as shown in the exemplary embodiment, be applied directly onto the surface of the semi-finished product to be provided with the functional layer. The mask can however also be arranged at a distance from the surface in order to create the desired shading.

In the exemplary embodiment the mask exhibits merely by way of example a single, large opening 21 within which the contact surface 22 of the component 15 and the contact surface 13 of the metal layer 11 are uncovered. In principle the mask is designed in such a way that areas which are not intended to be covered with an electric functional layer are shaded or concealed by the mask.

In the area of the opening 21 of the mask 20 a sacrificial layer 18 is applied to the surface of the semi-finished product.

In the exemplary embodiment the sacrificial layer 18 was applied after application of the mask 20, which is not, however, imperative. The sacrificial layer 18 is made of a conductive material and is applied directly to the uncovered contact surfaces 13 and 22, where the insulation layer 17 exhibits openings. Otherwise, the sacrificial layer 18 runs on the insulation layer 17. The sacrificial layer 18 therefore adapts to the three-dimensional surface structure of the semi-finished product.

The sacrificial layer 18 can be produced by sputtering. If necessary, the sputter layer can be made thicker by galvanic deposition. Preferably the sacrificial layer exhibits a thickness of 1 to 10 µm. The sacrificial layer 18 ensures that in particular the component 15 is not damaged when the electrically conductive particles are subsequently applied at high kinetic energy.

The powder particles for example of copper, titanium, silver, nickel or mixtures thereof, preferably in the form of nanoparticles, are applied by being blown onto the surface of the semi-finished product fitted with the mask 20. For this purpose, the particles are injected into a process gas which has been heated up and accelerated to supersonic speed. The process gas is accelerated for example by expansion through a nozzle. The process gas preferably exhibits a speed between 300 and 1,200 m/s. Mainly inert gases, in particular nitrogen, can be considered for use as carrier gases. The method for applying particles in powder form is also referred to as cold gas spraying.

Gradient materials which exhibit a metal as contact surfaces as well as a barrier layer of titanium can be applied.

Figure 2:
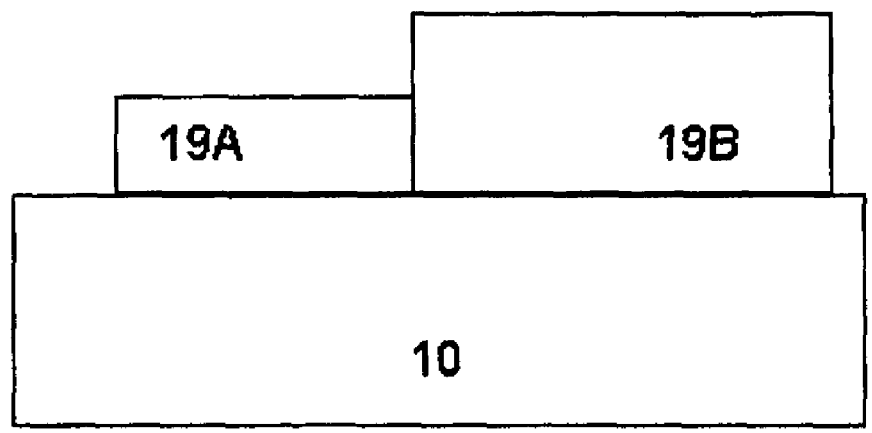
FIG. 2 is a side view of an electric functional layer formed in sections.

The thickness of the electric functional layer 19 is determined by the length of time for which the particles are blown onto the surface of the semi-finished product. Thicknesses of more than 100 µm can be achieved per minute. Referring to FIG. 2, the electric functional layer 19 may be formed in sections 19A, 19B having different respective thicknesses.

Figure 3:
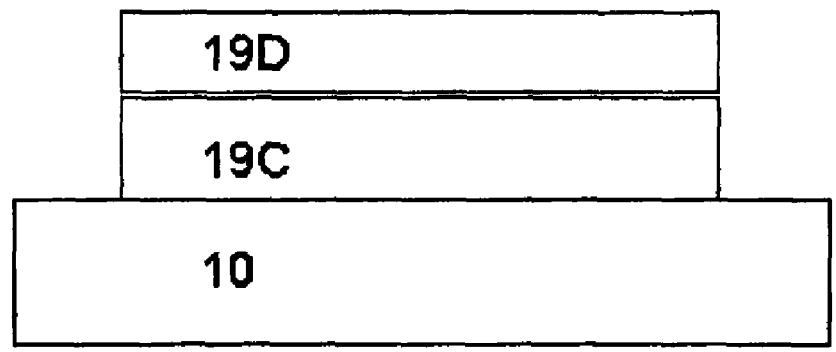
FIG. 3 is a side view of a layered electric functional layer.

The application of the electric functional layer 19 can take place in several steps in order to obtain a layered structure 19C 19D of the functional layer 19. See FIG. 3. Such a structure is advantageous in order to avoid copper migration. A further advantage exists in that structuring is possible by laser.

After the electric functional layer 19 has been produced the mask 20 can be removed from the surface of the produced electronic module.

Suitable materials for the mask include highly elastic materials, soft materials, porous or brittle materials. The use of a preformed metal mask with a surface coating on which metal does not adhere or a structured photo foil with a silicone surface is also conceivable.

Silicone rubber for example can be used as a highly elastic material for a mask. It absorbs the kinetic energy from the particles as they impact on the mask. Soft mask materials change their shape as the particles are applied and therefore lead to poor adhesion between the mask and the particles. As a result, the material not reaching the surface of the semi-finished product can be re-used. Porous or brittle materials, for example ceramic pastes, break off during cold gas spraying and absorb the energy of the particles.

In a further embodiment not shown in the FIGURE one or several further metal layers can be applied to the functional layer 19, for example exclusively in the vicinity of the component 15, to improve the thermal properties. An insulating layer or a cooling element or layer can then in turn be applied.

The method proposed by the inventors makes it possible to produce electronic modules with multi-layer or stack structures in which insulation layers and electric functional layers can be arranged alternately on top of each other.

An electronic module produced using the proposed method is advantageous in that the electrical connections are realized at a planar level so that the component is low in height. The method in particular not only enables conductor path structures to be produced but also makes it possible to form an electrically conductive layer on extensive surface areas. As a result, the EMC behavior of the electronic module can be improved.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in Superguide v. DIRECTV, 69 USPQ2d 1865 (Fed. Cir. 2004).

The invention claimed is:

1. A method to produce an electronic device, comprising:
    securing a semiconductor chip to a surface of a substrate;
    forming a sacrificial layer on exposed portions of the semiconductor chip and the surface of the substrate, the sacrificial layer being formed of a conductive metal; and
    forming an electric functional layer at least partially over the semiconductor chip by blowing powder particles of an electrically conductive material selectively toward the surface of the substrate so that the powder particles form an adhering layer on impact, the electric functional layer being formed directly on the sacrificial layer such that the sacrificial layer absorbs kinetic energy from the powder particles upon impact of the powder particles,
    the sacrificial layer being interposed between the semiconductor chip and the electric functional layer.

2. The method as claimed in claim 1, further comprising:
    heating a process gas to accelerate the process gas to a speed of between 300 and 1200 m/s and produce an accelerated process gas; and
    injecting the powder particles into the accelerated process gas.

3. The method as claimed in claim 2, wherein
    the powder particles injected into the accelerated process gas are made of copper, titanium, silver, nickel or a mixture thereof.

4. The method as claimed in claim 2, wherein
    the powder particles are injected into the accelerated process gas as nanoparticles.

5. The method as claimed in claim 2, wherein
    the process gas is expanded to accelerate the process gas.

6. The method as claimed in claim 1, wherein
    the electric functional layer is applied over the full surface of the substrate.

7. The method as claimed in claim 1, wherein
    the electric functional layer is applied selectively to the surface of the substrate in order to form a conductor path structure.

8. The method as claimed in claim 1, wherein
    the electric functional layer is formed in sections having different respective thicknesses.

9. The method as claimed in claim 1, wherein
    in the production of the electric functional layer passive elements are formed on the substrate surface.

10. The method as claimed in claim 1, wherein
    the electric functional layer is formed by forming a plurality of layers of different materials.

11. The method as claimed in claim 1, wherein the electric functional layer is formed by forming a plurality of layers of the same material.

12. The method as claimed in claim 1, wherein the thickness of the electric functional layer is between 20 µm and 5 mm.

13. The method as claimed in claim 1, wherein the sacrificial layer is produced by forming a plurality of thin metal contact layers by at least one of sputtering, vapor deposition and physical vapor deposition (PVD).

14. The method as claimed in claim 1, wherein the sacrificial layer is a sputter layer formed by sputtering, and the sputter layer is thickened by galvanic deposition.

15. The method as claimed in claim 1, wherein the sacrificial layer is produced to a thickness of 1 µm to 10 µm.

16. The method as claimed in claim 1, wherein the powder particles are applied to the surface of the substrate using a structured mask.

17. The method as claimed in claim 16, wherein the structured mask is formed of an elastic material which absorbs kinetic energy of the powder particles on impact.

18. The method as claimed in claim 16, wherein the structured mask changes shape on impact of the powder particles.

19. The method as claimed in claim 16, wherein the structured mask breaks off during cold gas spraying.

20. The method as claimed in claim 16, wherein the structured mask is a preformed metal mask with a surface coating that prevents adhesion of the powder particles on the surface coating.

21. The method as claimed in claim 16, wherein the structured mask is a light structured photo-sensitive foil with a surface made of silicone.

22. The method as claimed in claim 1, further comprising: forming an insulation layer over the substrate after securing the semiconductor chip to the substrate, the electric functional layer being formed over the insulation layer.

23. The method as claimed in claim 22, wherein the insulation layer is formed from a plastic, glass or ceramic material.

24. An electronic module comprising:

a substrate;

a semiconductor chip secured to a surface of the substrate;

a sacrificial layer formed on exposed portions of the semiconductor chip and the surface of the substrate, the sacrificial layer being formed of a conductive metal; and an electrically conductive functional layer formed at least partially over the semiconductor chip, the functional layer being produced by blowing powder particles of an electrically conductive material selectively toward the surface of the substrate so that the powder particles form an adhering layer on impact, the electric functional layer being formed directly on the sacrificial layer such that the sacrificial layer absorbs kinetic energy from the powder particles upon impact of the powder particles, the sacrificial layer being interposed between the semiconductor chip and the electric functional layer.

\* \* \* \* \*

UNITED STATES PATENT AND TRADEMARK OFFICE
CERTIFICATE OF CORRECTION

PATENT NO. : 8,395,257 B2
APPLICATION NO. : 12/310070
DATED : March 12, 2013
INVENTOR(S) : Jens-Christian Holst et al.

Page 1 of 1

It is certified that error appears in the above-identified patent and that said Letters Patent is hereby corrected as shown below:

On the Title Page, Item [75] (Inventors), Delete "Muünchen" and insert -- München --, therefor.
On the Title Page, Item [86] (PCT No.), Delete "PCT/EP2007/057833" and insert
-- PCT/EP2007/057883 --, therefor.

Signed and Sealed this
Second Day of July, 2013

Teresa Stanek Rea
*Acting Director of the United States Patent and Trademark Office*